US008200352B2

(12) United States Patent
Park et al.

(10) Patent No.: US 8,200,352 B2
(45) Date of Patent: Jun. 12, 2012

(54) METHOD OF SETTING AN EQUALIZER IN AN APPARATUS TO REPRODUCE A MEDIA FILE AND APPARATUS THEREOF

(75) Inventors: Young-min Park, Yongin-si (KR); Dong-soo Jun, Seoul (KR); Young-gyoo Choi, Yongin-si (KR)

(73) Assignee: SAMSUNG Electronics Co., Ltd., Suwon-si (KR)

( * ) Notice: Subject to any disclaimer, the term of this patent is extended or adjusted under 35 U.S.C. 154(b) by 984 days.

(21) Appl. No.: 12/173,999

(22) Filed: Jul. 16, 2008

(65) Prior Publication Data

US 2009/0024662 A1    Jan. 22, 2009

(30) Foreign Application Priority Data

Jul. 18, 2007    (KR) .................. 10-2007-0071683

(51) Int. Cl.
*G06F 17/00*    (2006.01)

(52) U.S. Cl. ........................................ 700/94; 381/103

(58) Field of Classification Search .................. 700/94; 381/98, 101, 103, 104, 107
See application file for complete search history.

(56) References Cited

U.S. PATENT DOCUMENTS

| 2001/0031066 A1* | 10/2001 | Meyer et al. .................. 382/100 |
| 2005/0201572 A1* | 9/2005 | Lindahl et al. ................ 381/103 |
| 2006/0106472 A1* | 5/2006 | Romesburg et al. ............ 700/94 |
| 2007/0136327 A1* | 6/2007 | Kim et al. ..................... 707/100 |

FOREIGN PATENT DOCUMENTS

| KR | 2007-14808 | 2/2003 |
| KR | 2003-42902 | 6/2003 |
| KR | 2004-41850 | 5/2004 |
| KR | 2006-116383 | 11/2006 |

OTHER PUBLICATIONS

Chinese Office Action Issued on Mar. 1, 2012 in CN Patent Application No. 200880023675.0.

* cited by examiner

*Primary Examiner* — Walter F Briney, III
(74) *Attorney, Agent, or Firm* — Stanzione & Kim, LLP

(57) ABSTRACT

A method and apparatus to reproduce a media file including reading mapping information from a predetermined position of the media file, searching for a sound field effect file of the media file by referring to the mapping information, and setting an equalizer of the audio data on the basis of the sound field effect file. A user can reproduce a media file by using an optimized equalizer of each media file even though the user himself does not set the equalizer. Also, since an equalizer setting of the reproducing apparatus can be applied to another reproducing apparatus, a user can enjoy listening to a media file in the other reproducing apparatus under the same reproducing conditions as those of the reproducing apparatus.

13 Claims, 6 Drawing Sheets

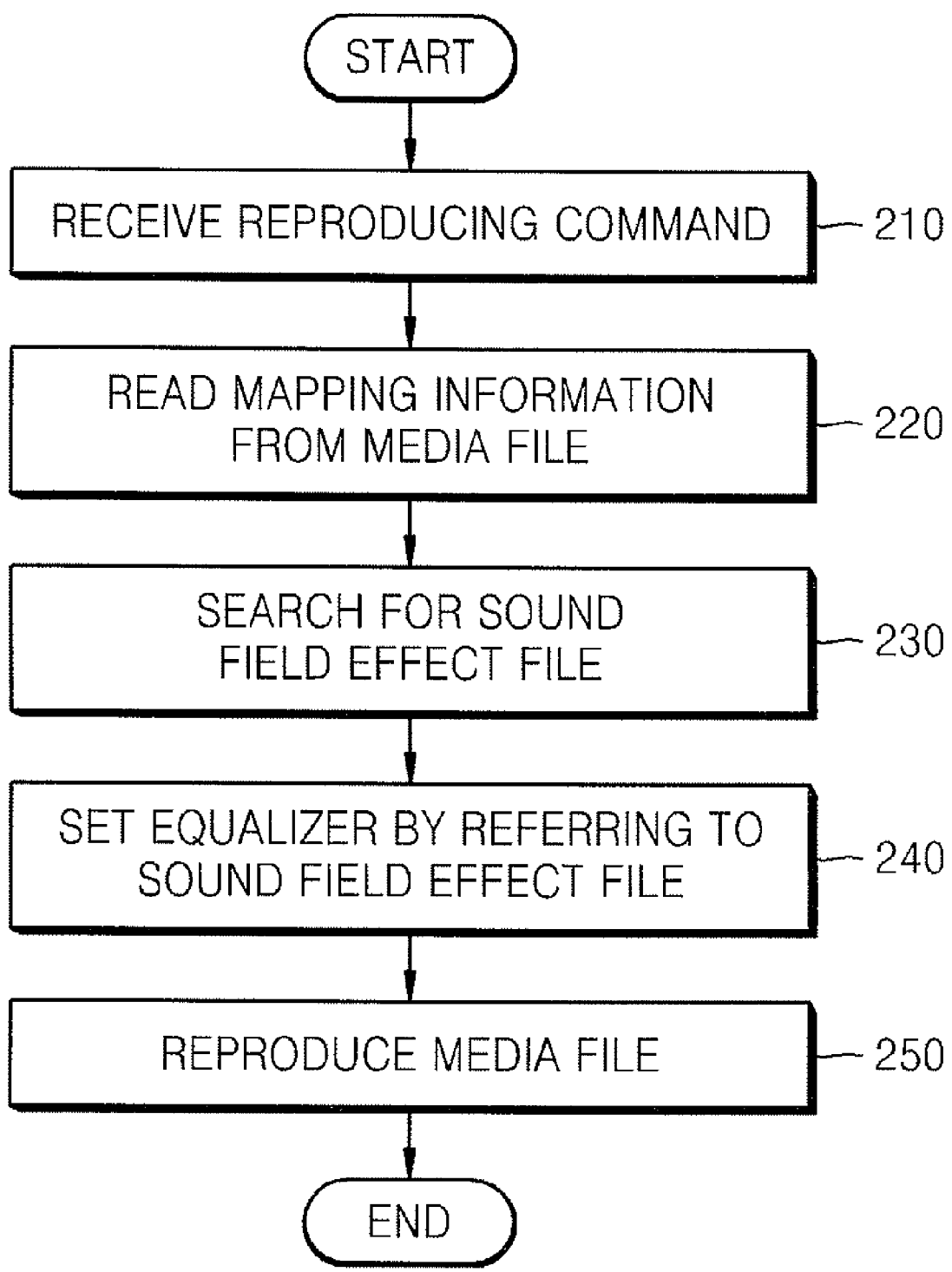

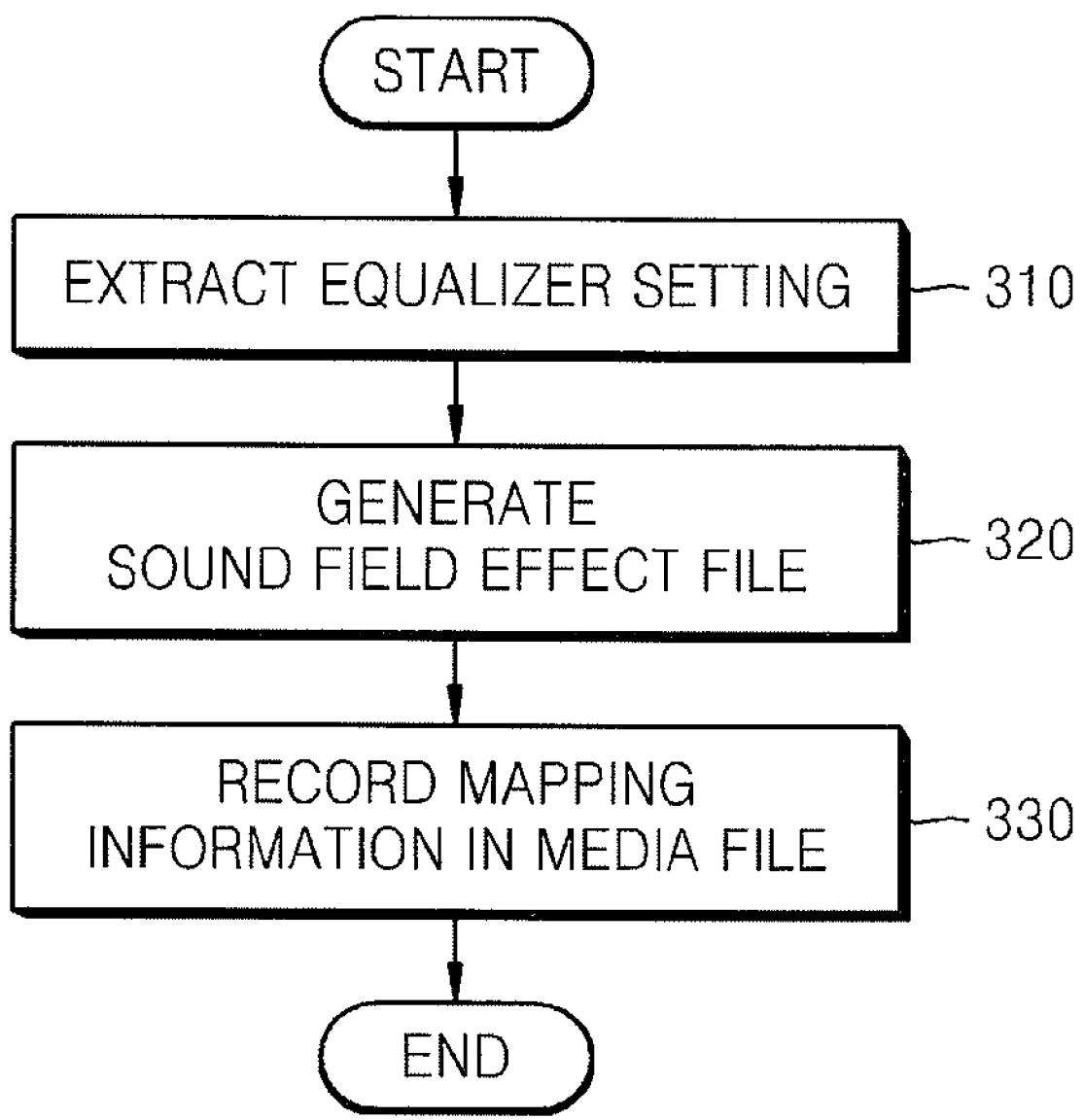

METHOD OF SETTING AN EQUALIZER IN AN APPARATUS TO REPRODUCE A MEDIA FILE AND APPARATUS THEREOF

CROSS-REFERENCE TO RELATED APPLICATIONS

This application claims the benefit of Korean Patent Application No. 10-2007-0071683, filed on Jul. 18, 2007, in the Korean Intellectual Property Office, the disclosure of which is incorporated herein in its entirety by reference.

BACKGROUND OF THE INVENTION

1. Field of the Invention

The present general inventive concept relates to a method of reproducing a media file, and more particularly, to a method of setting an equalizer when a media file including audio data is reproduced.

2. Description of the Related Art

Conventionally, an apparatus to reproduce a media file such as a music file or movie file includes an equalizer function. Using the equalizer function, a user can reproduce audio data according to their taste by increasing or decreasing the size of a specific frequency band.

FIG. 1A is a view of a method of setting an equalizer, according to a conventional method. In conventional digital audio devices, when a user sets an equalizer, a menu is primarily displayed on the screen of the conventional digital audio devices, as illustrated in FIG. 1. As illustrated in FIG. 1, the user selects one of the menus that are previously set according to music genres such as classical, jazz, dance, or house, and applies various equalizer settings for listening enjoyment of the audio data.

If the previously set menus do not suit the taste of the user, the user can select a menu such as <user EQ> to manually control the amplitude for each frequency band. When the user selects the <user EQ> menu, an apparatus for reproducing a media file provides a user interface, as illustrated in FIG. 1B, on a display device of the apparatus.

However, according to the conventional method, once the equalizer is set, the same equalizer settings are applied equally to all media files until the user changes the settings. Accordingly, if the user wants to enjoy various genre of music by using an optimized equalizer setting for each genre, the user must manually set the equalizer whenever the genre of music is changed. Also, if the user discovers an optimized equalizer setting using a particular reproducing apparatus, there is no way to apply such optimized equalizer setting to another reproducing apparatus when the user wants to enjoy the same media file in the other reproducing apparatus. Thus, the settings of the equalizer need to be reset one by one to match the optimized setting of each device, thus causing inconvenience to the user.

SUMMARY OF THE INVENTION

The present general inventive concept provides an apparatus to set an equalizer setting of each media file to be reproduced, and a method of setting the equalizer.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept can be achieved by providing a method of reproducing a media file including audio data, including reading mapping information from a predetermined position of the media file, searching for a sound field effect file of the media file by referring to the mapping information, and setting an equalizer of the audio data on the basis of the sound field effect file.

The method may also include recording the mapping information in the predetermined position of the media file.

The method may further include extracting an equalizer setting while the media file or another media file is being reproduced, and generating the sound field effect file by using the extracted equalizer setting.

The method may further include selecting one of a plurality of sound field effect files represented respectively by a plurality of mapping information according to a user input, if a plurality of mapping information are read, wherein the sound field effect file found in the searching operation is the selected sound field effect file.

The mapping information may include information representing a position of the sound field effect file in a local directory of the apparatus to reproduce the media file.

The mapping information may include a uniform resource locator (URL) of the sound field effect file.

The foregoing and/or other aspects and utilities of the present general inventive concept can also be achieved by providing a computer readable recording medium having embodied thereon a computer program to execute the foregoing method.

The foregoing and/or other aspects and utilities of the present general inventive concept can also be achieved by providing an apparatus to reproduce a media file comprising audio data, including a mapping information reading unit to read mapping information from a predetermined position of the media file, a file searching unit to search a sound field effect file of the media file by referring to the mapping information, and an equalizer setting unit to set an equalizer setting of the audio data on the basis of the sound field effect file.

The apparatus may further include a mapping information recording unit to record the mapping information in the predetermined position of the media file.

The apparatus may further include an extracting unit to extract an equalizer setting while the media file or another media file is being reproduced, and a file generating unit to generate the sound field effect file by using the extracted equalizer setting.

The apparatus may further include a selecting unit to select one of a plurality of sound field effect files represented respectively by a plurality of mapping information according to a user input, if a plurality of mapping information are read, wherein the sound field effect file found by the file searching unit is the selected sound field effect file.

The mapping information may include information representing a position of the sound field effect file in a local directory of the apparatus to reproduce the media file.

The mapping information may also include a uniform resource locator (URL) of the sound field effect file.

The foregoing and/or other aspects and utilities of the present general inventive concept can also be achieved by providing a method of setting an equalizer of a media reproduction apparatus, including determining an equalizer setting of a first reproduction apparatus to reproduce a media file, and transmitting the equalizer setting to a second reproduction apparatus to reproduce the media file according to the transmitted equalizer setting.

The method may further include generating a sound field effect file based on the equalizer setting, and storing the sound field effect file on a web server, wherein the second reproduction apparatus reads the equalizer setting of the web server to set an equalizer of the second reproduction apparatus without downloading the sound field effect file from the web server.

The method may further include setting an equalizer of the second reproduction apparatus according to the equalizer setting only when the media file of the second reproduction apparatus has substantially the same genre as the media file of the first reproduction apparatus.

The method may further include generating a sound field effect file based on the equalizer setting, storing the sound field effect file in a user region of the media file, and transmitting the sound field effect file and the media file to the second reproduction apparatus in response to a command of the second reproduction apparatus, wherein an equalizer of the second reproduction apparatus is set by referring to the transmitted sound field effect file.

The foregoing and/or other aspects and utilities of the present general inventive concept can also be achieved by providing an apparatus to reproduce a media file, including an equalizer setting unit to set an equalizer of a first reproduction apparatus to reproduce a media file, and a connection unit to transmit the equalizer setting to a second reproduction apparatus to reproduce a media file according to the transmitted equalizer setting.

The apparatus may further include a file generating unit to generate a sound field effect file based on the equalizer setting, and a web server to store the sound field effect file, wherein the second reproduction apparatus reads the equalizer setting of the web server to set an equalizer of the second reproduction apparatus without downloading the sound field effect file from the web server.

The apparatus may further include a file generating unit to generate a sound field effect file based on the equalizer setting, and a storage unit to store the sound field effect file in a user region of the media file, wherein the communication unit transmits the sound field effect file and the media file to the second reproduction apparatus in response to a command of the second reproduction apparatus, and wherein an equalizer of the second reproduction apparatus is set by referring to the transmitted sound field effect file.

BRIEF DESCRIPTION OF THE DRAWINGS

These and/or other aspects and utilities of the present general inventive concept will become apparent and more readily appreciated form the following description of the embodiments, taken in conjunction with the accompanying drawings of which:

FIG. 2 is a flowchart of a method of setting an equalizer when a media file is to be reproduced, according to an embodiment of the present general inventive concept;

FIG. 3 is a flowchart of a method of generating a sound field effect file, according to an embodiment of the present general inventive concept;

DETAILED DESCRIPTION OF THE PREFERRED EMBODIMENTS

Figure 1A:
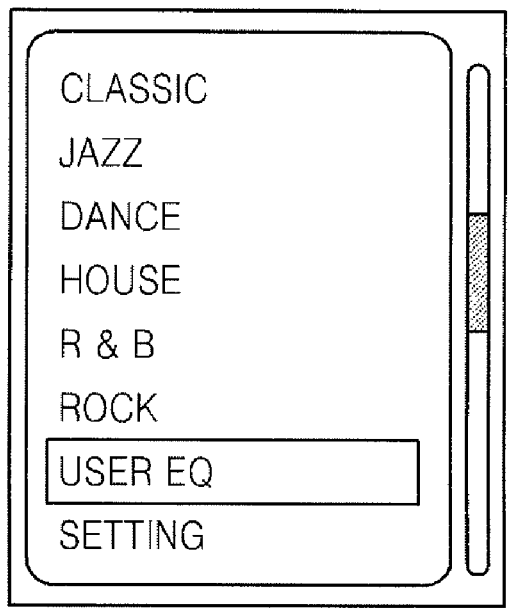
FIGS. 1A and 1B are views of a method of setting an equalizer, according to a conventional method.
Figure 1B:
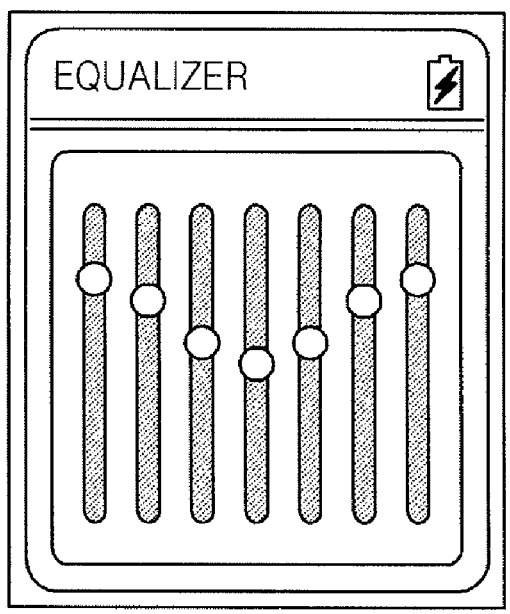

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

FIG. 2 is a flowchart of a method of setting an equalizer when a media file is to be reproduced, according to an embodiment of the present general inventive concept. Here, the media file may be a media file including audio data such as a music file, a movie file, and the like.

In operation 210, a user can provide a reproducing command to the apparatus to reproduce a predetermined media file.

In operation 220, the apparatus to reproduce the media file can read mapping information from a previously set position of the media file, and can differentially set the equalizer for each media file. The equalizer setting of the media file can be stored in a different file from the media file. Such different file will be referred to herein as a 'sound field effect file'.

The sound field effect file can be applied to reproduce the media file in accordance with the stored equalizer setting. In order to search for the sound field effect file, mapping information representing a position of the corresponding sound field effect file can be used to locate the sound field effect file. The mapping information can be recorded in a predetermined position of the corresponding media file. That is, the predetermined position can be a region that is reserved to record the mapping information in the media file, and generally, may be a user region in accordance with various standard media formats.

The sound field effect file that is to be mapped to the media file may be stored locally in the apparatus to reproduce the media file, or may be stored in an external device. Accordingly, if the sound field effect file is stored in the apparatus to reproduce the media file, mapping information may include information representing a position of the sound field effect file in a local directory of the apparatus to reproducing the media file. On the other hand, if the sound field effect file is stored in an external device, the mapping information may include information to locate the sound field effect file in the external device, for example a uniform resource locator (URL) of the sound field effect file.

According to another embodiment of the present general inventive concept, a plurality of mapping information can be recorded in a media file. In this case, a variety of optimized equalizer settings can be stored according to the particular apparatus used to reproduce the media file. In this case, the apparatus to reproduce the media file can display to a user the plurality of mapping information and/or the name of a sound field effect file corresponding to the mapping information, and the user can select one of the various sound field effect files according to the desired user input.

In operation 230, the apparatus to reproduce the media file can search for a sound field effect file. Accordingly, when a plurality of mapping information are read in operation 220, the sound field effect file selected according to a user input can be searched.

If the corresponding mapping information is stored in an external device, the apparatus to reproduce the media file can access a home network, the internet, or the like, to search for the sound field effect file.

In operation 240, when the sound field effect file is found, the apparatus to reproduce the media file can analyze the found sound field effect file, and can set the equalizer accordingly.

In operation 250, the stored equalizer settings can then be applied to reproduce the media file according to the stored equalizer settings.

FIG. 3 is a flowchart of a method of generating a sound field effect file, according to an embodiment of the present general inventive concept.

In operation 310, if a user pushes a predetermined button to input a command while an apparatus to reproduce a media file is reproducing a media file, an equalizer setting that is being applied to reproduce the media file can be extracted.

In operation 320, a sound field effect file can be generated using the extracted equalizer setting.

In operation 330, the apparatus to reproduce the media file can record mapping information about the sound field effect file generated in operation 320 in a predetermined position of the media file in accordance with the user input. Here, it is assumed that the user can generate the sound field effect file by using the equalizer setting that was manually set by the user while the user is reproducing the media file, and can map the sound field effect file and the corresponding media file to record the mapping information in the corresponding media file. It is understood that the media file of operation 310 and the media file of operation 330 may be different from each other. That is, since a variety of sound field effect files can be applied to the media file, the sound field effect file to be applied may be variously selected by the user. For example, if the user desires to listen to music from "Metallica" as recorded on their mp3 player, the user may select a sound field effect file provided from the home page of "Metallica".

Figure 4:
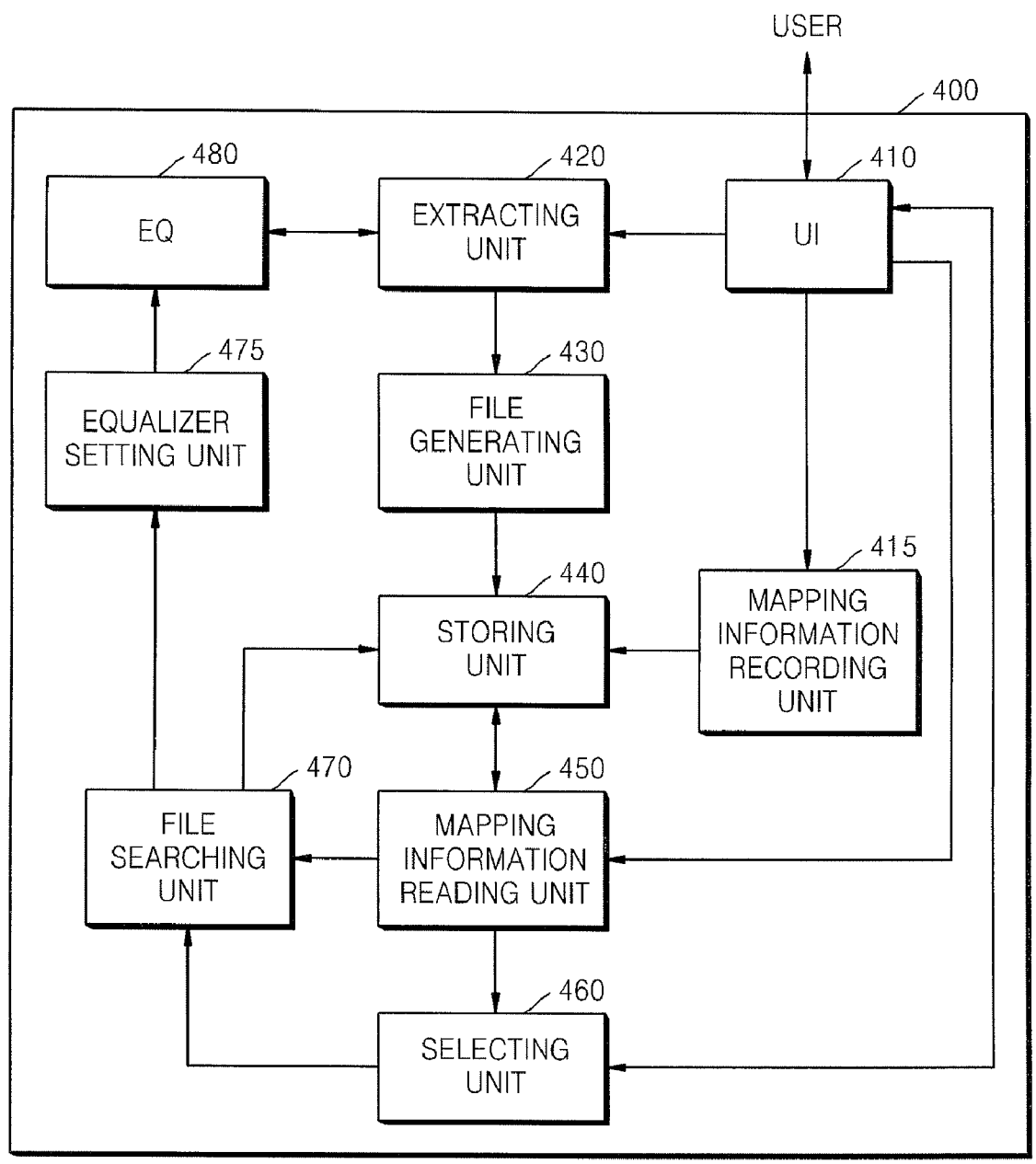
FIG. 4 is a block diagram of a structure of an apparatus to reproduce a media file and to set an equalizer setting, according to an embodiment of the present general inventive concept.

FIG. 4 is a block diagram of a structure of an apparatus 400 to reproduce a media file and to set an equalizer setting, according to an embodiment of the present general inventive concept.

Referring to FIG. 4, the apparatus 400 can include a user interface 410, a mapping information recording unit 415, an extracting unit 420, a file generating unit 430, a storing unit 440, a mapping information reading unit 450, a selecting unit 460, a file searching unit 470, an equalizer setting unit 475, and an equalizer 480. The apparatus 400 may also include a digital/analog converter (DAC), a decoder, a synthesizer, a connection unit to connect with other devices, and the like. However, elements that are well-known in the art or are not directly related to the present general inventive concept will not be described or illustrated in detail or will be omitted to avoid obscuring the present general inventive concept in unnecessary detail.

As illustrated in FIG. 4, if a user inputs a command through the user interface 410 to generate a sound field effect file associated with the current reproducing environment while the user is reproducing the media file through the apparatus 400, the extracting unit 420 can extract the equalizer setting of the media file from the equalizer 480.

The file generating unit 430 can generate the sound field effect file by using the extracted equalizer setting of the media file. In the present embodiment, the storing unit 440 can store a sound field effect file, a media file, and the like.

If the user inputs a reproducing command associated with a predetermined media file through the user interface 410, the mapping information reading unit 450 can read mapping information from a predetermined position of the corresponding media file. If a plurality of mapping information are read, the selecting unit 460 can select one of the plurality of mapping information, that is, one of the plurality of sound field effect files that is mapped to the media file in accordance with the user input.

The file searching unit 470 can search for the sound field effect file by referring to the mapping information read from the media file by employing the mapping information reading unit 450 or in accordance with the selection of the selecting unit 460. If the corresponding sound field effect file is stored in the apparatus 400, the storing unit 440 can be accessed. Alternatively, the file searching unit 470 can search for the sound field effect file by accessing the internet via a home network as described above.

The equalizer setting unit 475 can analyze the sound field effect file found by the file searching unit 470 to set the equalizer 480. Then, the set equalizer 480 can be applied to reproduce the media file as desired by the user.

The apparatus 400 of FIG. 4 can be embodied as a module usable in a portable device or in other devices such as a personal computer (PC), and can be embodied as software, without departing from the principles and spirit of the present general inventive concept.

Figure 5:
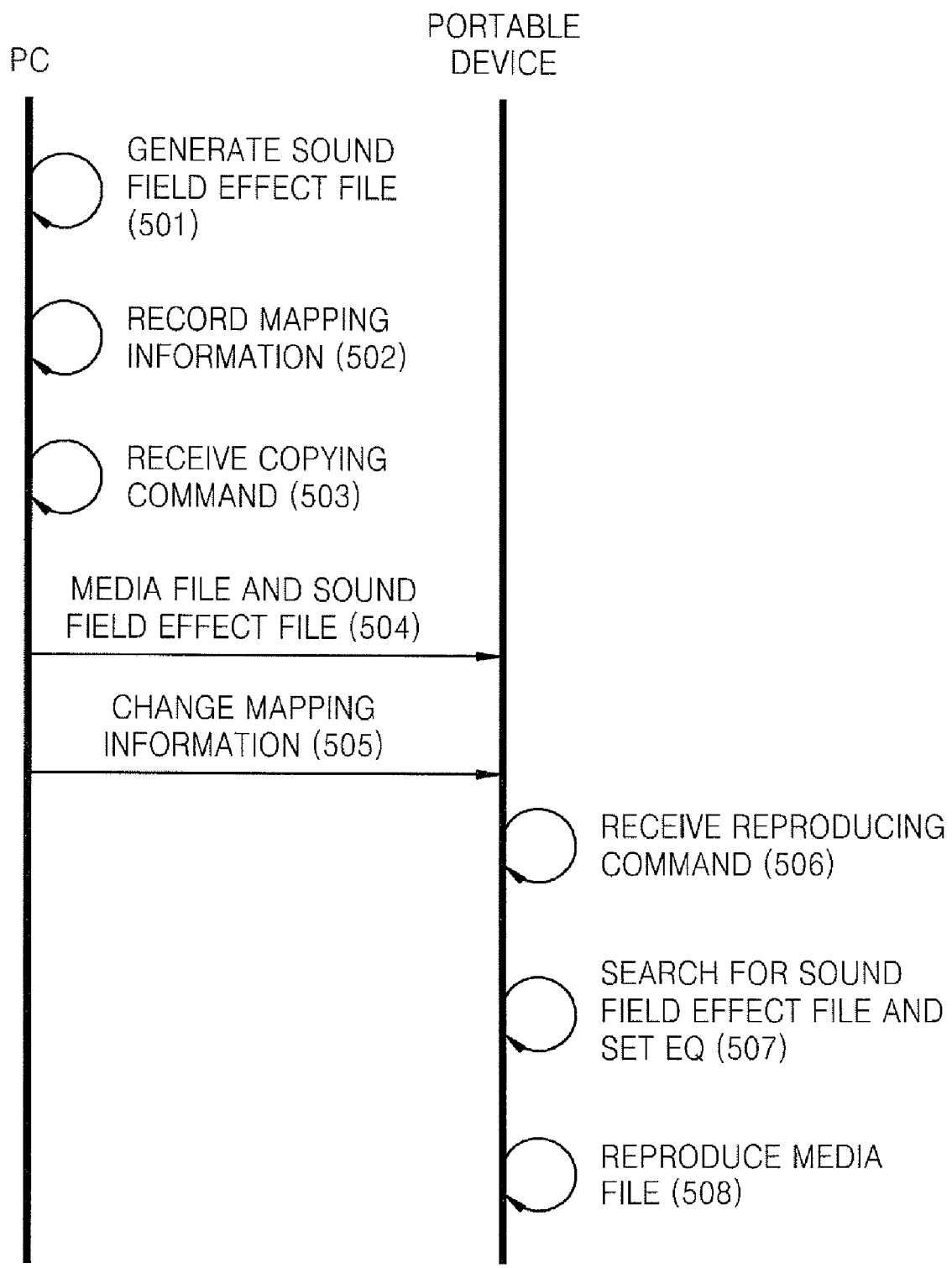
FIG. 5 is a flowchart of a method of reproducing a media file, according to an embodiment of the present general inventive concept.

FIG. 5 is a flowchart of a method of reproducing a media file, according to an embodiment of the present general inventive concept.

Here, it is assumed that the user is using a portable device to reproduce a media file with the same equalizer setting used to reproduce the media file on a PC. Also, it is assumed that the portable device of the user does not have a networking function.

In this example, in operation 501, once the user determines an optimal equalizer setting for the "beatles-yesterday.mp3" file that is being reproduced, the user can command via an application program to generate a respective sound effect file of the "beatles-yesterday.mp3" file. Here, the PC can generate a "beatles-yesterday.eql" file as a sound field effect file based on the equalizer setting of the media file being reproduced.

In operation 502, the PC can record the corresponding sound field effect file. That is, the PC can record position information of the "beatles-yesterday.eql" file in a user region of the "beatles-yesterday.mp3" file according to the user input. For example, the mapping information at this point may be the same format as "C:/music/eq_settings/beatles-yesterday.eql". In other words, the mapping information can represent a position of the mapping information in a directory structure of the PC.

In operation 503, the user can connect the portable device to the PC via a connection unit of the devices, and can input a command to copy the "beatles-yesterday.mp3" file to the portable device. The portable device may be, for example, a personal digital [data] assistant (PDA), a portable multimedia player (PMP), a MP3 player, or the like.

In operation 504, the PC can copy the "beatles-yesterday.mp3" file and the "beatles-yesterday.eql" file to the portable device.

In operation 505, the PC can change the mapping information of the copied "beatles-yesterday.mp3" file of operation 504 into mapping information of the portable device. That is, the information representing the position in the PC can be changed to the information representing the position in the portable device. For example, "C:/music/eq_settings/beatles-yesterday.eql" can be changed into " . . . /EQ/beatles-yesterday.eql".

In operation 506, the portable device can receive a reproducing command for the "beatles-yesterday.mp3" file.

In operation 507, the portable device can search for the "beatles-yesterday.eql" file by referring to " . . . /EQ/beatles-yesterday.eql", and thereby can set an equalizer setting of the portable device.

In operation 508, the portable device can apply the equalizer setting by referring to the "beatles-yesterday.eql" file to reproduce the "beatles-yesterday.mp3" file.

In the present embodiment, since the media file and the sound field effect file that is mapped to the media file can both be stored in the portable device, it is not necessary for the portable device to have a networking function.

However, if the portable device has a networking function, operation 504 may be performed to copy only the media file instead of both of the media and sound field effect files. In this case, operation 505 to change the mapping information can be omitted. However, in this case, the mapping information may not only include information representing a position in the directory structure in the PC as for example "C:/music/eq_settings/beatles-yesterday.eql", but may also include a URL of the sound field effect file stored in the PC.

Figure 6:
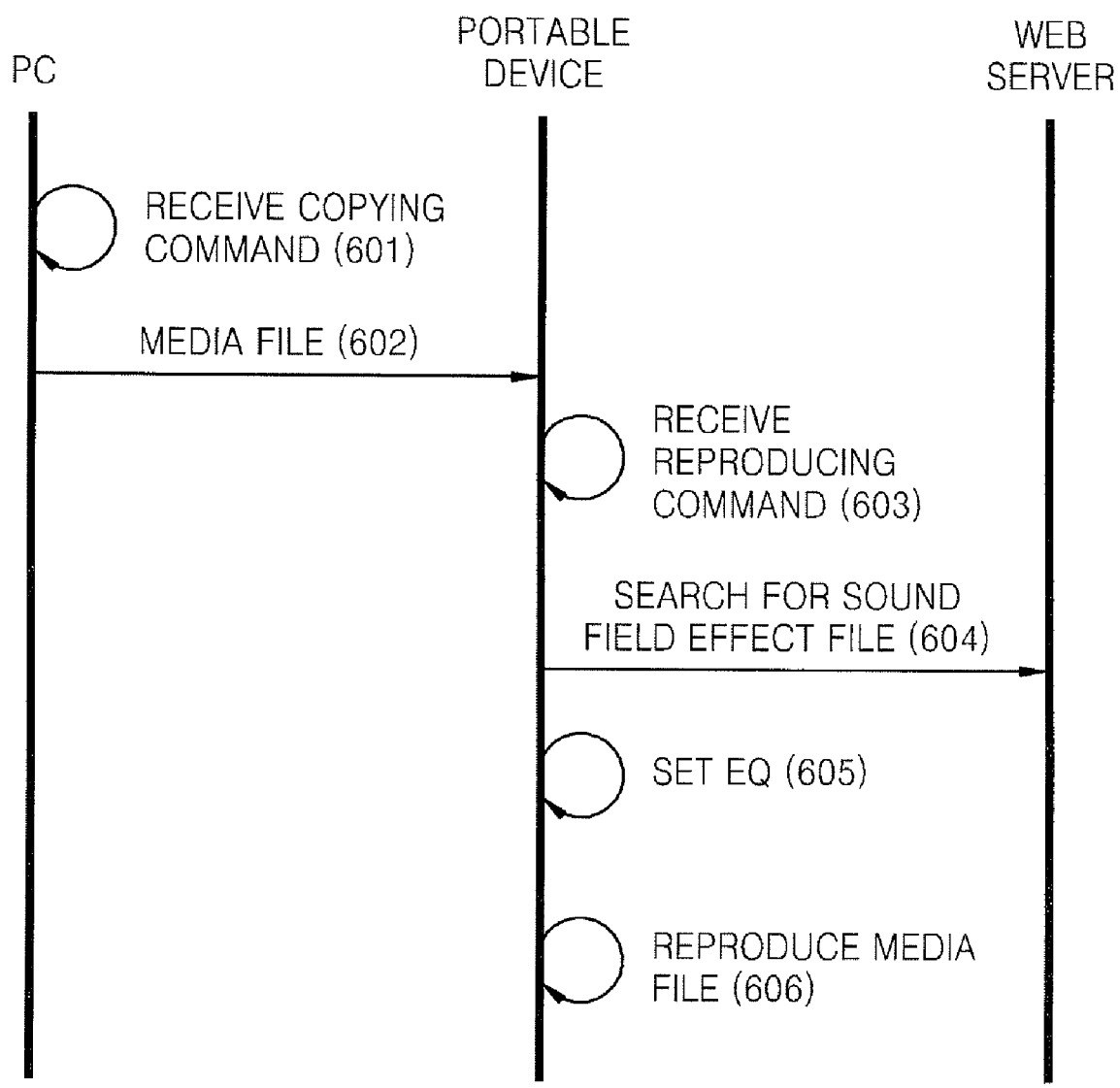
FIG. 6 is a flowchart of a method of reproducing a media file, according to another embodiment of the present general inventive concept.

FIG. 6 is a flowchart of a method of reproducing a media file, according to another embodiment of the present general inventive concept. Here, similar to FIG. 5, a user can reproduce a media file on the portable device using the same equalizer setting as when the media file was being reproduced on a PC. In this case, the portable device of the user can include a networking function.

In operation 601, a PC can receive a command from a user to copy a predetermined media file into a portable device. Here, a sound field effect file mapped to the media file can be provided from a remote web server, and accordingly, mapping information recorded in the media file can include a URL of the sound field effect file.

In operation 602, the PC can copy the corresponding media file to the portable device.

In operation 603, a reproducing command of the copied media file can be input to the portable device.

In operation 604, the portable device can recognize the mapping information as the URL, and can access a web server through the internet to search for the sound field effect file. Here, if the portable device finds the sound field effect file stored in the web server, the portable device can read an equalizer setting therefrom, thus making it unnecessary to download the sound field effect file itself.

In operation 605, the portable device can set an equalizer setting according to the sound field effect file provided by the web server.

In operation 606, the media file, designated by the user can be reproduced by applying the equalizer setting.

The present general inventive concept can also be embodied as computer-readable codes on a computer-readable medium. The computer-readable medium can include a computer-readable recording medium and a computer-readable transmission medium. The computer-readable recording medium is any data storage device that can store data which can be thereafter read by a computer system. Examples of computer-readable recording media include read-only memory (ROM), random-access memory (RAM), CD-ROMs, magnetic tapes, floppy disks, optical data storage devices. The computer-readable recording medium can also be distributed over a network of coupled computer systems so that the computer-readable code is stored and executed in a decentralized fashion. The computer-readable transmission medium can transmit carrier waves and signals (e.g., wired or wireless data transmission through the Internet). Also, functional programs, codes, and code segments to accomplish the present general inventive concept can be easily construed by programmers skilled in the art to which the present general inventive concept pertains.

According to the present general inventive concept, a user can reproduce a media file by using an optimized equalizer setting of each media file without having to adjust the equalizer setting.

Also, since an equalizer setting that is set in a first reproducing apparatus can be applied to another reproducing apparatus, a user can enjoy a media file in the other reproducing apparatus under the same reproducing conditions as those of the first reproducing apparatus.

Also, since a user can share a sound field effect file through a network system, for example the web, the user can enjoy a media file by applying an equalizer setting as set by others for the same media file.

Although a few embodiments of the present general inventive concept have been illustrated and described, it will be appreciated by those skilled in the art that changes may be made in these embodiments without departing from the principles and spirit of the general inventive concept, the scope of which is defined in the appended claims and their equivalents.

What is claimed is:

1. A method of reproducing a media file comprising audio data, the method comprising:
   reading mapping information from the media file;
   searching for sound field effect files of the media file by referring to the mapping information;
   selecting a sound field effect file located by the searching unit, if the searching unit locates more than one sound effect file; and
   setting an equalizer of the audio data on the basis of the selected sound field effect file.

2. The method of claim 1, further comprising:
   recording the mapping information in the predetermined position of the media file.

3. The method of claim 2, further comprising:
   extracting an equalizer setting while the media file or another media file is being reproduced; and
   generating the sound field effect file by using the extracted equalizer setting.

4. The method of claim 1, wherein the selecting comprises selecting the sound effect file based on input from a user.

5. The method of claim 1, wherein the mapping information comprises information representing a position of the sound field effect file in a local directory of an apparatus to reproduce the media file.

6. The method of claim 1, wherein the mapping information comprises a uniform resource locator (URL) of the sound field effect file.

7. A computer readable recording medium having embodied thereon a computer program to execute the method of claim 1.

8. An apparatus to reproduce a media file comprising audio data, the apparatus comprising:
   a mapping information reading unit to read mapping information from the media file;
   a file searching unit to search for sound field effect files of the media file by referring to the mapping information;
   a selecting unit to select a sound field effect file located by the searching unit, if the searching unit locates more than one sound effect file; and
   an equalizer setting unit to set an equalizer setting of the audio data on the basis of the selected sound field effect file.

9. The apparatus of claim 8, further comprising:

a mapping information recording unit to record the mapping information in the predetermined position of the media file.

10. The apparatus of claim 9, further comprising:

an extracting unit to extract an equalizer setting while the media file or another media file is being reproduced; and a file generating unit to generate the sound field effect file by using the extracted equalizer setting.

11. The apparatus of claim 8, wherein the selecting unit selects the sound effect file based on input from a user.

12. The apparatus of claim 8, wherein the mapping information comprises information representing a position of the sound field effect file in a local directory of the apparatus to reproduce the media file.

13. The apparatus of claim 8, wherein the mapping information comprises a uniform resource locator (URL) of the sound field effect file.

* * * * *